(12) United States Patent
Comadre et al.

(10) Patent No.: US 12,191,229 B2
(45) Date of Patent: Jan. 7, 2025

(54) SEMICONDUCTOR PACKAGE WITH BLIND HOLE ATTACHMENT TO HEAT SINK

(71) Applicant: Infineon Technologies AG, Neubiberg (DE)

(72) Inventors: Ryan Tordillo Comadre, Melaka (MY); Victor Dela Cruz Del Rosario, Melaka (MY); Bernie Tabanao Rosales, Melaka (MY); Subaramaniym Senivasan, Jasin (MY); Heng Chen Tang, Muar (MY)

(73) Assignee: Infineon Technologies AG, Neubiberg (DE)

( * ) Notice: Subject to any disclaimer, the term of this patent is extended or adjusted under 35 U.S.C. 154(b) by 533 days.

(21) Appl. No.: 17/509,746

(22) Filed: Oct. 25, 2021

(65) Prior Publication Data

US 2023/0125452 A1    Apr. 27, 2023

(51) Int. Cl.
*H01L 23/40* (2006.01)
*H01L 23/00* (2006.01)

(52) U.S. Cl.
CPC ...... *H01L 23/4093* (2013.01); *H01L 23/4006* (2013.01); *H01L 2023/405* (2013.01); *H01L 2023/4087* (2013.01); *H01L 24/48* (2013.01); *H01L 2224/48245* (2013.01)

(58) Field of Classification Search
CPC ............ H01L 23/4093; H01L 23/4006; H01L 23/49562; H01L 24/48
See application file for complete search history.

(56) References Cited

U.S. PATENT DOCUMENTS

| | | | |
|---|---|---|---|
| 5,130,888 A | 7/1992 | Moore | |
| 5,870,286 A * | 2/1999 | Butterbaugh | ........ H05K 1/0206 |
| | | | 361/708 |
| 6,255,722 B1 | 7/2001 | Ewer et al. | |
| 2017/0098598 A1* | 4/2017 | Otremba | ............. H01L 23/3107 |
| 2019/0057923 A1* | 2/2019 | Otremba | ............... H02M 7/003 |
| 2022/0270952 A1* | 8/2022 | Xu | ....................... H01L 23/4334 |

* cited by examiner

*Primary Examiner* — Marc Anthony Armand
(74) *Attorney, Agent, or Firm* — Murphy, Bilak & Homiller, PLLC

(57) ABSTRACT

A semiconductor package includes a lead frame that includes a die pad and a plurality of leads, a semiconductor die mounted on a die attach surface of the die pad, an encapsulant body of electrically insulating material that covers semiconductor die and portions of the lead frame, and a fastener receptacle that includes a blind hole in the encapsulant body or the die pad, wherein a rear surface of the die pad is exposed from a first main face of the encapsulant body.

20 Claims, 6 Drawing Sheets

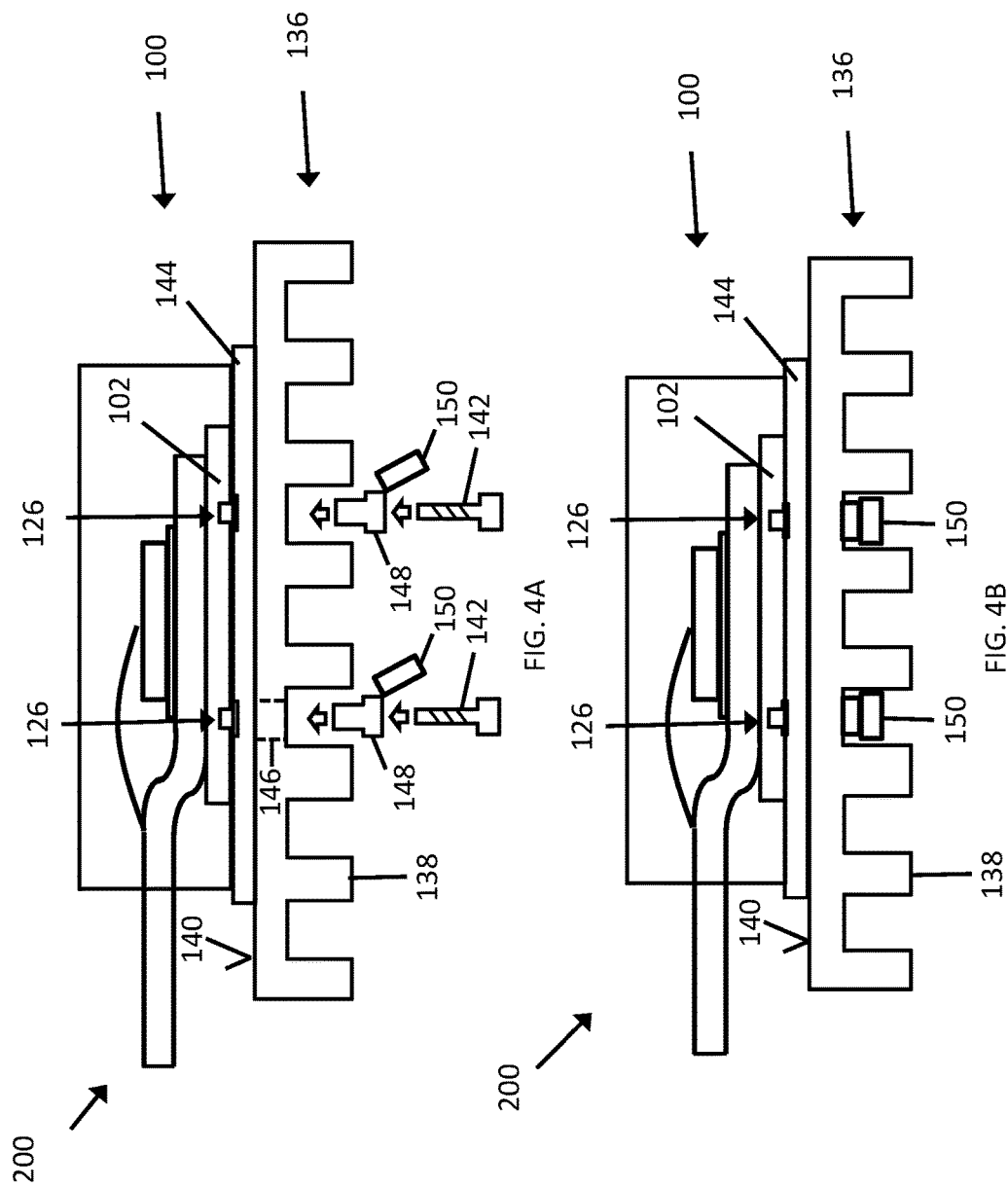

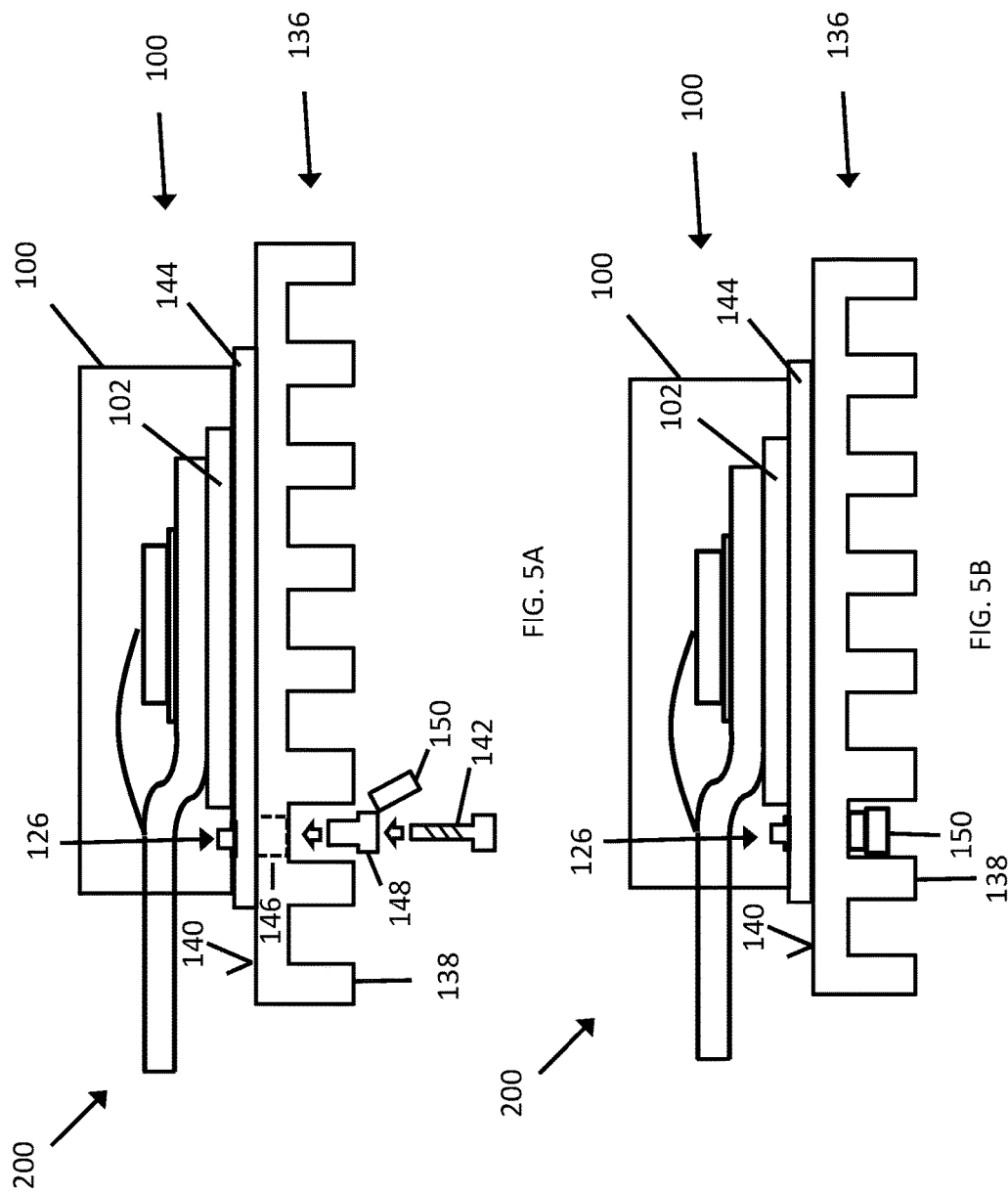

SEMICONDUCTOR PACKAGE WITH BLIND HOLE ATTACHMENT TO HEAT SINK

TECHNICAL FIELD

The instant application relates to semiconductor packaging, and more particularly to semiconductor packages

BACKGROUND

Discrete high-voltage semiconductor devices such as MOSFETs (metal oxide semiconductor field effect transistors), IGBTs (insulated gate bipolar transistors), diodes, etc., are commonly packaged in a molded semiconductor package that includes several leads protruding out an encapsulant body. These types of semiconductor packages are commonly used in high power applications such as automotive, power transmission, HVAC, etc. An important performance consideration in semiconductor packages is heat dissipation. As power semiconductor devices typically generate a substantial amount of heat during operation, package designers seek to improve the thermal dissipation characteristics of the semiconductor package, as it can lead to a favorable improvement in performance. Typical molding materials used to form the package encapsulant body offer excellent electrical insulation properties, but are poor thermal insulators. There is a need to improve the thermal dissipation capability of semiconductor packages without sacrificing electrical performance.

SUMMARY

A semiconductor package is disclosed. According to an embodiment, the semiconductor package comprises a lead frame that comprises a die pad and a plurality of leads, a semiconductor die mounted on a die attach surface of the die pad, an encapsulant body of electrically insulating material that covers semiconductor die and portions of the lead frame, and a fastener receptacle that comprises a blind hole in the encapsulant body or the die pad, and wherein a rear surface of the die pad is exposed from a first main face of the encapsulant body.

Separately or in combination, the blind hole is formed in the rear surface of the die pad or the first main face of the encapsulant body.

Separately or in combination, the fastener receptacle further comprises an insert that is disposed within the blind hole.

Separately or in combination, the insert comprises a central opening that is dimensioned to receive a cylindrical fastener.

Separately or in combination, the insert comprises a central opening that is dimensioned to receive a snap-fit connector, the snap-fit connector comprising at least one angled intersection between two linear surfaces.

Separately or in combination, the blind hole is formed in the rear surface of the die pad.

Separately or in combination, the semiconductor die overlaps with the fastener receptacle.

Separately or in combination, the fastener receptacle further comprises a metal insert that is disposed within the blind hole, and wherein the insert has a greater material hardness than the die pad.

Separately or in combination, the fastener receptacle further comprises a second blind hole is formed in the rear surface of the die pad.

Separately or in combination, the blind hole is formed in the first main face of the encapsulant body.

Separately or in combination, the fastener receptacle further comprises a metal or plastic insert that is disposed within the blind hole, and wherein the insert has a greater material hardness than the encapsulant body.

Separately or in combination, the leads are disposed in an area of the first main face that is between the die pad and a first outer edge side of the encapsulant body that the leads protrude out from.

A semiconductor assembly is disclosed. According to an embodiment, the semiconductor assembly comprises a heat sink, a semiconductor package comprising an encapsulant body of electrically insulating material, a die pad with a rear surface that is exposed from a first main face of the encapsulant body, and a fastener receptacle that comprises a blind hole in the encapsulant body or the die pad, and a fastener that is securely retained by the fastener receptacle and affixes the semiconductor package to the heat sink.

Separately or in combination, the heat sink comprises a planar package interface surface, wherein a rear surface of the die pad is exposed from a first main face of the encapsulant body, and wherein the rear surface of the die pad faces and is retained against the planar package interface surface by the fastener.

Separately or in combination, the blind hole is formed in the rear surface of the die pad, wherein the heat sink comprises a perforation that extends between the planar package interface surface and an outer surface of the heat sink, and wherein the semiconductor assembly further comprises an electrically insulating liner that is disposed within the perforation and receives the fastener.

Separately or in combination, the semiconductor assembly further comprises an electrically insulating cap that covers an outer head of the fastener.

A method of producing a semiconductor package is disclosed. According to an embodiment, the method comprises providing a lead frame that comprises a die pad, mounting a semiconductor die on a die attach surface of the die pad, forming an encapsulant body of electrically insulating material that covers the semiconductor die and portions of the lead frame, and forming a fastener receptacle in the semiconductor package, wherein forming the fastener receptacle comprises forming a blind hole in the encapsulant body or the die pad.

Separately or in combination, the blind hole is formed in a rear surface of the die pad that is exposed from the encapsulant body, and wherein forming the blind hole comprises half-etching the die pad before forming the encapsulant body.

Separately or in combination, the blind hole is formed in a first main face of the encapsulant body, and wherein the blind hole is formed during or after forming the encapsulant body.

Separately or in combination, forming the fastener receptacle further comprises providing an insert within the blind hole.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A, 1B and 1C, illustrates a semiconductor package, according to an embodiment. FIG. 1A schematically illustrates a side-view of the semiconductor package with outer surfaces of the encapsulant body outlined; FIG. 1B illustrates a mounting surface of the semiconductor package that comprises a first main face of the encapsulant body and an exposed die pad; FIG. 1C illustrates a second main face of the semiconductor package opposite from the first main face.

FIGS. 2A and 2B, illustrates a semiconductor package, according to an embodiment. FIG. 2A schematically illustrates a side-view of the semiconductor package with outer surfaces of the encapsulant body outlined; and FIG. 2B illustrates a mounting surface of the semiconductor package that comprises a first main face of the encapsulant body and an exposed die pad.

FIGS. 3A and 3B, illustrates an insert that is configured to be arranged in a blind hole of the semiconductor package, according to two different embodiments. FIG. 3A illustrates a plan-view and side view of an insert that is configured to accommodate a cylindrical fastener; and FIG. 3B illustrates a plan-view and side view of an insert that is configured to accommodate a rectangular pin-fit fastener.

FIG. 4, which includes FIGS. 4A and 4B, illustrates a semiconductor assembly that comprises a semiconductor package mounted on a heat sink, according to an embodiment. FIG. 4A illustrates the semiconductor assembly with an exploded view of the fasteners and liners used to secure the semiconductor package to the heat sink; and FIG. 4B illustrates the semiconductor assembly with the fasteners and liners in the secured position.

FIG. 5, which includes FIGS. 5A and 5B, illustrates a semiconductor assembly that comprises a semiconductor package mounted on a heat sink, according to another embodiment. FIG. 5A illustrates the semiconductor assembly with an exploded view of the fasteners and liners used to secure the semiconductor package to the heat sink; and FIG. 5B illustrates the semiconductor assembly with the fasteners and liners in the secured position.

DETAILED DESCRIPTION

Disclosed herein is a semiconductor package that comprises a fastener receptacle that is configured to receive a fastener. The semiconductor package can be mounted on a heat sink with an exposed die pad of the semiconductor package thermally coupled to the heat sink, with a fastener inserted in the fastener receptacle, thereby securing the semiconductor package to the heat sink. According to an embodiment, the fastener receptacle comprises a blind hole in the encapsulant body or the die pad of the semiconductor package. The blind hole allows for the fastener receptacle to be disposed at locations of the semiconductor package that overlap with other features. For instance, the fastener receptacle can be disposed at a location on the die pad that overlaps with the semiconductor die. Alternatively, the fastener receptacle can be disposed at a location on the encapsulant body that overlaps with the package leads. As a result, there is no need to provided a separate region of die pad or encapsulant body that is dedicated for receiving a fastener for mounting the semiconductor package. As a result, high thermal performance and small package footprint are simultaneously obtained.

Figures 1, 1A:
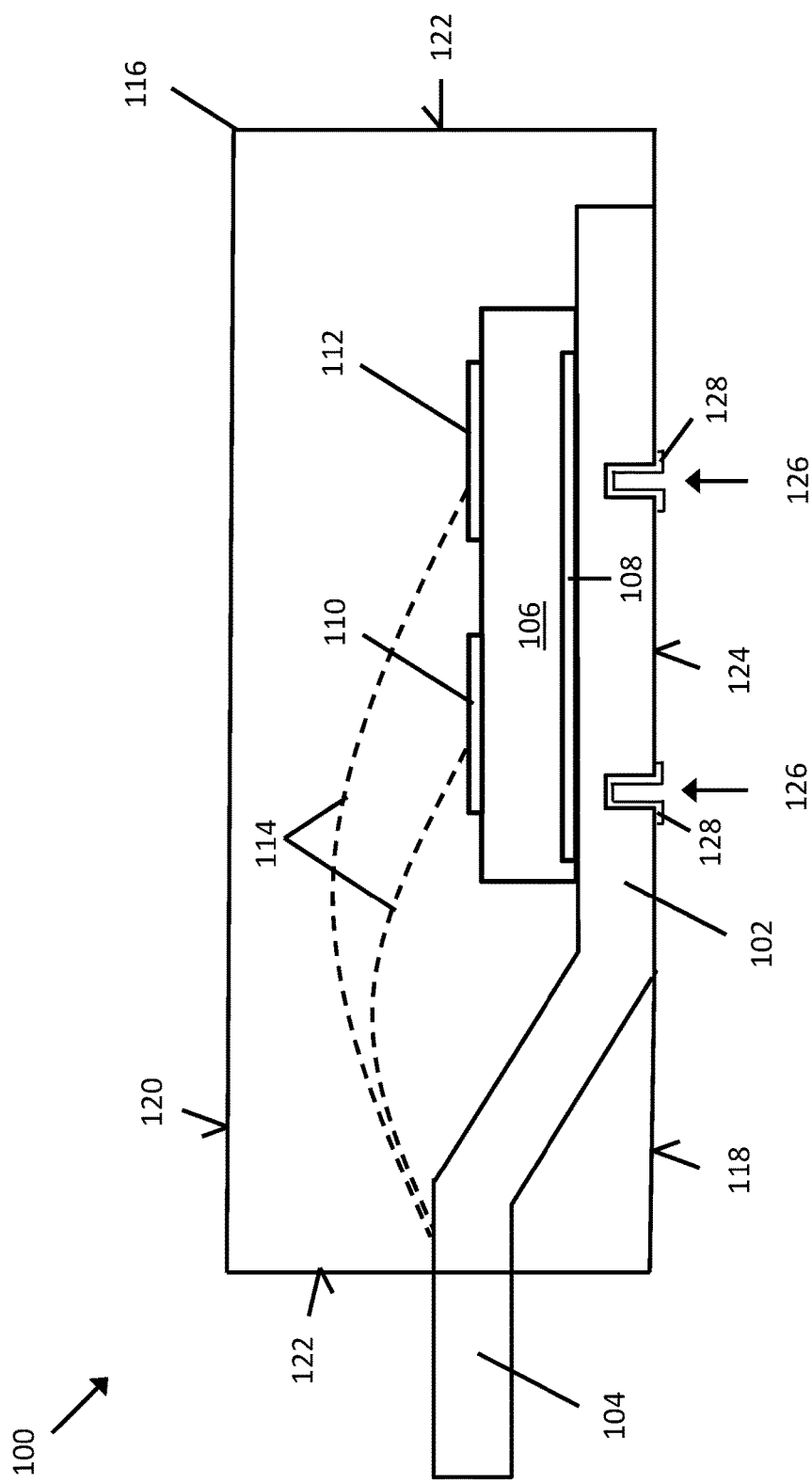
Figure 1:
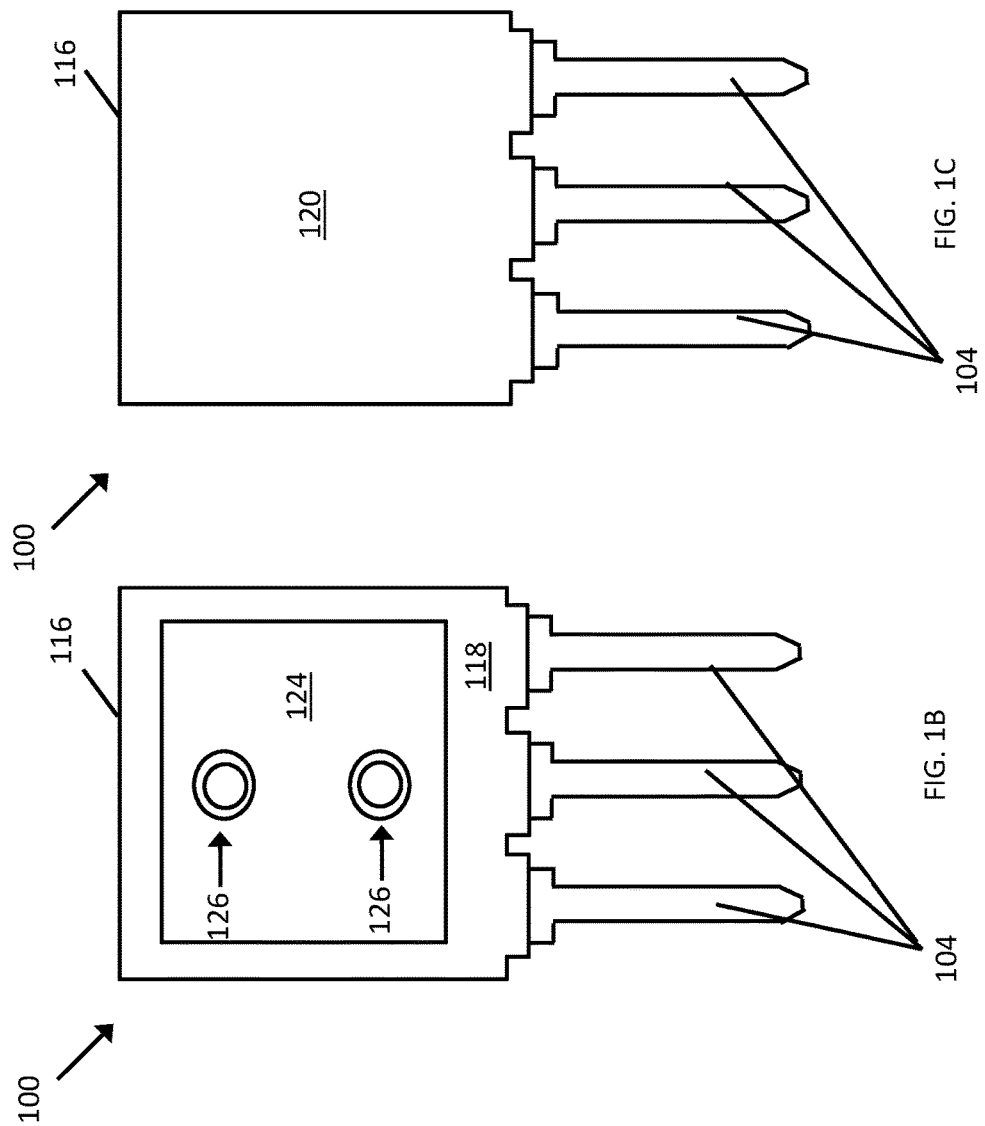
FIG. 1, which includes

Referring to FIG. 1, a semiconductor package 100 comprises a die pad 102 and a plurality of leads 104. The die pad 102 and the plurality of leads 104 can each be provided by a metal lead frame structure comprising (Cu), aluminum (Al), nickel (Ni), silver (Ag), palladium (Pd), gold (Au), etc., and alloys or combinations thereof. The leads 104 are configured to be inserted into a circuit carrier, such as a PCB. In the depicted embodiments, the semiconductor package 100 comprises three of the leads 104. More generally, the semiconductor package 100 may comprise different numbers of the leads 104, e.g., two, four, five, etc.

A semiconductor die 106 is mounted on a planar die attach surface of the die pad 102. Generally speaking, the semiconductor die 106 can have a wide variety of device configurations, including discrete device configurations and integrated circuit configurations. The semiconductor die 106 can comprise type IV semiconductor materials, e.g., silicon, silicon germanium, silicon carbide, etc., and/or type III-V semiconductor materials, e.g., gallium nitride, gallium arsenide, etc. The semiconductor die 106 can be configured as a vertical device, which refers to a device that is configured to control a current flowing between a main (upper) surface of the semiconductor die 106 and a rear (lower) surface of the semiconductor die 106. Alternatively, the semiconductor die 106 can be configured as a lateral device, which refers to a device that is configured to control a current flowing parallel to a main (upper) surface of the die.

According to an embodiment, the semiconductor die 106 configured as a discrete power device. A discrete power device refers to a device that is configured to block high voltages and and/or to conduct high currents. For example, a discrete power device may be rated to block high voltages of at least 100V, and more commonly on the order of 250V, 500V, 600V, 1,200V, 2,000V and/or may be rated to conduct currents of 10 A, 50 A, 100 A, 500 A or more. Examples of discrete power devices include power diodes, power MOSFETs (Metal Oxide Semiconductor Field Effect Transistors), IGBTs, (Insulated Gate Bipolar Transistors) and HEMTs (High Electron Mobility Transistors). A discrete power device may comprise multiple ones of these device types connected in parallel within the die and/or multiple cells connected in parallel within the die.

The terminals of the semiconductor die 106 are electrically connected to the leads 104 from the lead frame. The semiconductor die 106 may comprise a first lower surface terminal 108 that faces and is electrically connected to the die pad 102, which in turn is connected to one of the leads 104 via a continuous metal connection between the two structures. The lead 104 connected with the first lower surface terminal 108 may be a central one of the leads 104 from the perspective of FIGS. 1B and 1C. The electrical connection between the first lower surface terminal 108 and the die pad 102 may be effectuated by a conductive adhesive, e.g., solder, sinter, glue, etc. The semiconductor die 106 may comprise a first upper surface terminal 110 that faces away from the die pad 102. The first upper surface terminal 110 is electrically connected to a different one of the leads 104 as the first lower surface terminal 108. The lead 104 connected with the first upper surface terminal 110 may be an outer one of the leads 104 from the perspective of FIGS. 1B and 1C. The first lower surface terminal 108 and the first upper surface terminal 110 may be the load terminals of the semiconductor die 106. For instance, the first lower surface terminal 108 and the first upper surface terminal 110 may respectively correspond to the source and drain terminals or vice-versa in the case of a MOSFET, or may respectively correspond to the collector and emitter terminals or vice-versa in the case of an IGBT, and so forth. The semiconductor die 106 may comprise a second upper surface terminal 112 that faces away from the die pad 102. The second upper surface terminal 112 is electrically connected to a different one of the leads 104 as the first upper surface terminal 110 and the first lower surface terminal 108. The lead 104 connected with the second upper surface terminal 112 may be an outer one of the leads 104 from the perspective of FIGS. 1B and 1C that is opposite from the lead connected with the first upper surface terminal 110. The second upper surface terminal 112 may be a gate terminal that is configured to control a conductive connection between the load terminals of the semiconductor die 106. The first upper surface terminal 110 and the second upper surface terminal 112 may be electrically connected to the leads by electrical interconnect elements 114, which may be bond wires, clips, or ribbons, for example.

The terminal configuration and/or lead configuration of the semiconductor package 100 may vary from what is shown. For example, the semiconductor package 100 may be configured to comprise additional leads 104 are independently connected to the load terminals or the gate terminals and are configured as sensing terminals. Separately or in combination, the semiconductor die 106 may be configured as a lateral device wherein each of the leads 104 are spaced apart from the die pad 102 and connected to upper surface terminals of the semiconductor die 106.

The semiconductor package 100 comprises an encapsulant body 116 that covers semiconductor die 106 and portions of the lead frame. The encapsulant body 116 comprises an electrically insulating material that protects and electrically isolates the semiconductor die 106 and associated electrical connections. Examples of these electrically insulating materials include mold compound, thermosetting plastic, epoxy, resins, and laminate materials. According to an embodiment, the encapsulant body 116 is formed by a molding process such as injection molding, compression molding, transfer molding, etc. In that case, the encapsulant body 116 can comprise a plastic material such as mold compound, thermosetting plastic, etc. According to an embodiment, the encapsulant body 116 is formed by a lamination technique. In that case, the encapsulant body 116 can comprise lamination materials such as glass fiber material, e.g., FR-4.

The encapsulant body 116 comprises a first main face 118, a second main face 120 that is opposite from the first main face 118 and outer edge sides 122 that extend between the first and second main faces 118, 120. A rear surface 124 of the die pad 102 that is opposite from the semiconductor die 106 is exposed from the first main face 118 of the encapsulant body 116. As a result, the rear surface 124 of the die pad 102 and the first main face 118 collectively form a mounting surface of the semiconductor package 100 that can be mounted flush against another structure, such as a heat sink or PCB, and the rear surface 124 of the die pad 102 can form an electrical and/or thermal connection with the other structure. As shown, the rear surface 124 of the die pad 102 is coplanar with the first main face 118, thus forming a continuous planar surface. Alternatively, the rear surface 124 of the die pad 102 can be offset from the first main face 118 in either direction.

The semiconductor package 100 further comprises a fastener receptacle 126. The fastener receptacle 126 is a structure that is configured to insertably receive a fastener, such as a screw, pin or bolt so that the semiconductor package 100 can be securely retained against another structure. According to an embodiment, the fastener receptacle 126 comprises a blind hole that is formed in the encapsulant body 116 or the die pad 102. A blind hole is recess that is formed to a specified depth and does not extend to the other side of the structure to which it is formed in. Thus, the blind hole comprises a defined bottom surface that is formed in the encapsulant body 116 or the die pad 102, as the case may be.

In the depicted embodiment, the blind hole is formed in the rear surface 124 of the die pad 102. Generally speaking, this blind hole may be formed according to a variety of different techniques, e.g., etching, drilling, etc. This blind hole may be formed in the lead frame structure prior to mounting of the semiconductor die 106 and/or prior to forming the encapsulant body 116. For example, the blind hole may be a half-etched feature of the lead frame that comprises the die pad 102 and the leads 104. Alternatively, the blind hole may be formed by drilling into the rear surface 124 of the die pad 102 after forming the encapsulant body 116.

According to an embodiment, the fastener receptacle 126 further comprises an insert 128 that is disposed within the blind hole. The insert 128 is a structure that lines the sidewalls and bottom of the blind hole and comprises a central opening 130 (identified in FIG. 3) that is dimensioned to receive a fastener. The insert 128 therefore is an intermediary structure between the surfaces of the blind hole and the fastener that is inserted in the blind hole. The insert 128 can be securely affixed within the blind hole, e.g., by an adhesive. Alternatively, the insert 128 can be configured to be inserted in the blind hole and mechanically retained by the structure which comprises the through a force-fitting relationship.

Generally speaking, the insert 128 can comprise a wide variety of materials including electrical insulators, e.g., plastics, ceramics, etc., or electrical conductors, e.g., metals such as copper or aluminum. In an embodiment wherein the blind hole is formed in the rear surface 124 of the die pad 102 and the insert 128 is a metal structure, the insert 128 may have a greater material hardness than the die pad 102. In this context, material hardness may be measured on the Vickers scale (Hv). By making the material of the insert 128 to be harder than the die pad 102, this allows the insert 128 to be securely retained by the die pad 102 through plastic deformation of the die pad 102, and minimizes plastic deformation of the insert 128. In one example, the die pad 102 comprises pure or substantially pure copper, and the insert 128 comprises a copper alloy that is harder than pure or substantially pure copper, e.g., K88 alloy copper.

According to an embodiment, the semiconductor package 100 comprises multiple ones of the fastener receptacles 126. For example, as shown, the semiconductor package 100 comprises first and second ones of the fastener receptacles 126 that each comprise blind holes formed in the rear surface 124 of the die pad 102, along with corresponding inserts 128 provided in the blind holes. In this way, the semiconductor package 100 can be secured by multiple ones of the fasteners, thereby providing additional mechanical stabilization and/or ensuring enhanced thermal coupling. The number and arrangement of the fastener receptacles 126 may vary from what is shown.

According to an embodiment, the semiconductor die 106 overlaps with the fastener receptacle 126. This means that the fastener receptacle 126 is disposed within an area that is defined by outer boundaries of the semiconductor die 106 and projects vertically perpendicular to the die attach surface. As shown, the semiconductor die 106 overlaps with both of the fastener receptacles 126. This arrangement eliminates the need to extend the die pad 102 beyond the outer edge sides of the semiconductor die 106 in order to effectuate a fastened connection with the semiconductor package, as would be required if a complete through-hole in the lead frame was used to secure the semiconductor package. In this way, the package footprint is minimized while simultaneously allowing for the semiconductor package to be affixed to a heat sink by a fastener.

Figure 2:
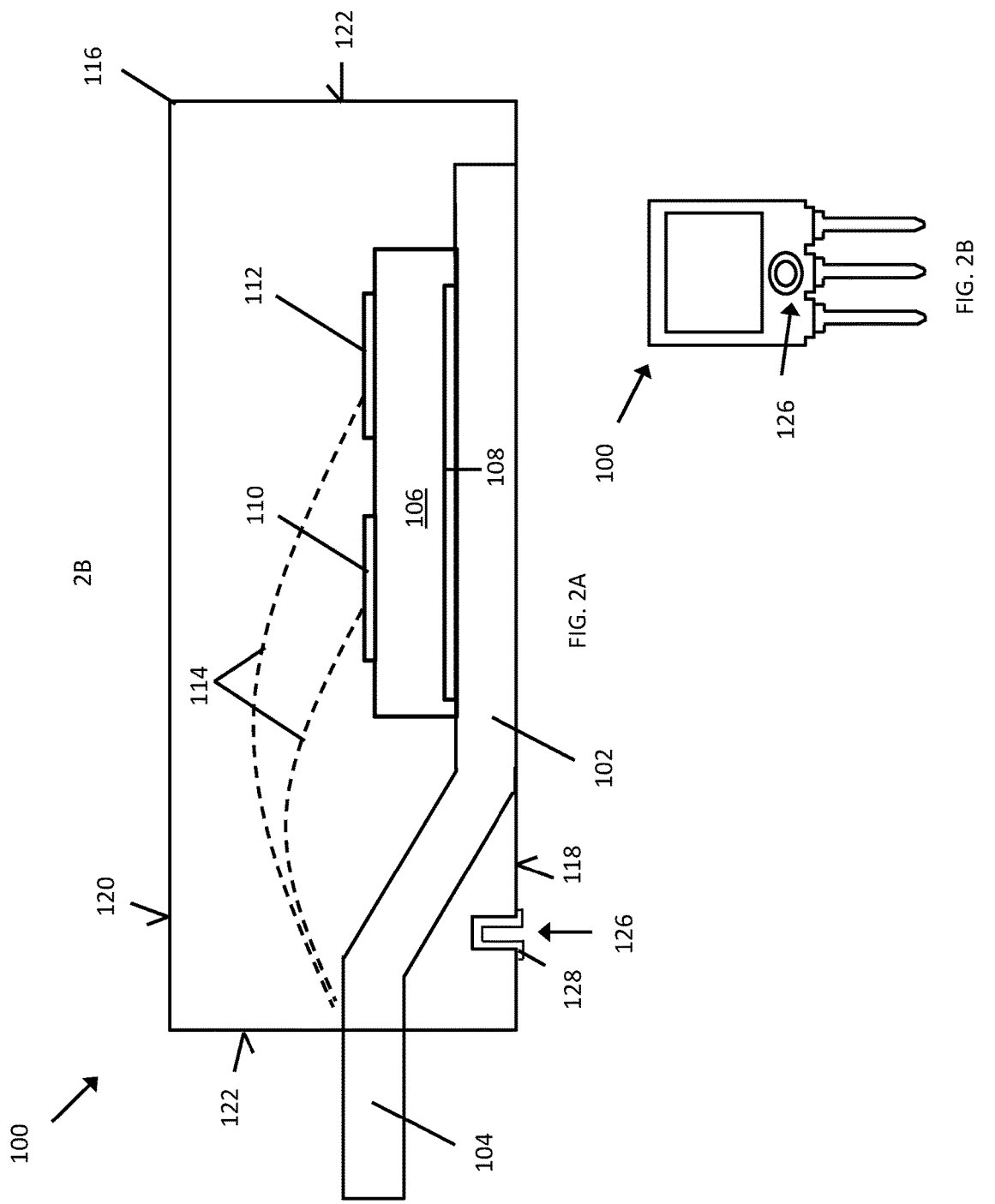
FIG. 2, which includes

Referring to FIG. 2, the semiconductor package 100 is depicted, according to another embodiment. In this embodiment, fastener receptacle 126 is disposed in the encapsulant body 116. In particular, the blind hole is formed in an area of the first main face 118 of the encapsulant body 116 that is between the die pad 102 and a first one of the outer edge sides 122 of the encapsulant body 116 that the leads 104 protrude out from. As can be seen, the lead frame may have a so-called downset configuration wherein the leads 104 bend downward as they approach the die pad 102. In that case, there may be sufficient clearance for the blind hole to be formed in the encapsulant body 116 directly underneath one of the leads 104. Alternatively, the blind hole in the encapsulant body 116 may be formed at a location that is laterally between two of the leads 104.

The fastener receptacle 126 disposed in the encapsulant body 116 may additionally comprise the insert 128 arranged in the blind hole in a similar manner as previously described. In this case, the insert 128 may comprise a metal or a plastic with a greater material hardness than the encapsulant body 116. This allows the insert 128 to be securely retained by the encapsulant body 116 through plastic deformation of the encapsulant body 116, and minimizes plastic deformation of the insert 128.

The blind hole of the fastener receptacle 126 may be formed during the formation of the encapsulant body 116. For example, the encapsulant body 116 may be formed by a molding process wherein cylindrical pins are placed in the mold cavity, wherein these cylindrical pins displace the liquified mold compound during the molding process, thereby creating the blind hole. Moreover, the insert 128 may be incorporated into the encapsulant body 116 as part of the molding process. For example, the insert 128 can be arranged over the cylindrical pins during the molding process. As a result, the inserts 128 are adhered to the mold compound via the molding process. According to another technique, the encapsulant body 116 can be formed to comprise a blind hole without the insert 128 molded within the blind hole. The blind hole can be formed during the molding process, e.g., using cylindrical pins, or after the molding process, e.g., by drilling into the encapsulant body 116. Subsequently, the insert 128 may be press-fitted into the blind hole. The dimensions of the blind hole can be such that a force-fitting relationship with the inserts 128 exist. According to one technique, the insert 128 is a metal structure that is heated during the insertion process so as to ease the insertion and soften the adjacent encapsulant material. Separately or in combination, the blind hole can have a tapered geometry that gradually narrows moving away from the first main face 118 of the encapsulant body 116 so as to enhance mechanical pressure.

Figure 3:
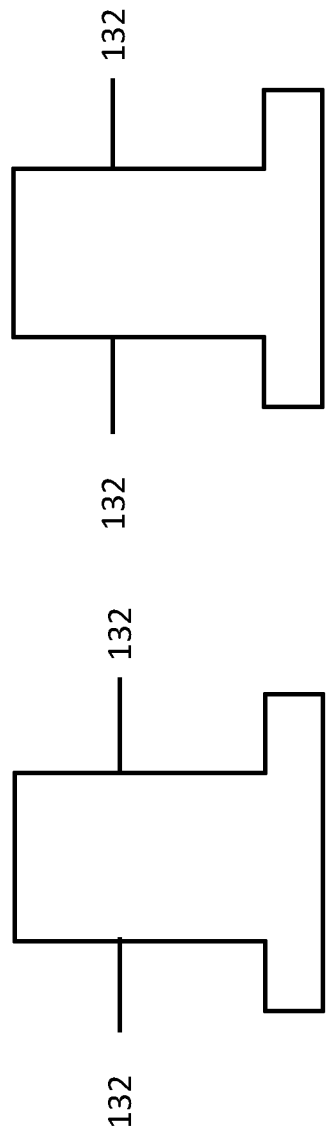
FIG. 3, which includes
Figure 3:
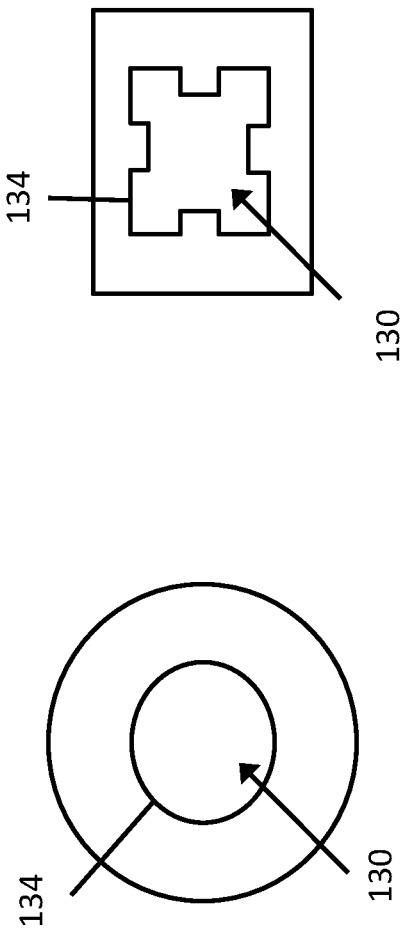

Referring to FIG. 3, two potential configurations for the insert 128 are shown. These insert 128 configurations may be used for either one of the embodiments described with reference to FIGS. 1-2. In each case, the insert 128 comprises outer sidewalls 132 that interface with the structure to which the blind hole is formed in. The insert 128 comprises further comprises a central opening 130 that is dimensioned to receive a particular type of fastener. In the case of FIG. 3A, the insert 128 comprises a central opening 130 that is dimensioned to receive a cylindrical fastener, such as a screw, pin or bolt. Optionally, the sidewalls 134 defining the central opening 130 may be threaded, so that the insert 128 can securely retain a threaded fastener such as a screw in a commonly known manner. In the case of FIG. 3A, the insert 128 comprises a central opening 130 that is dimensioned to receive a snap-fit connector. The snap-fit connector may have a rectangular geometry, with the sidewalls 134 defining the central opening 130 comprising multiple angled intersections between two linear surfaces, thereby providing a degree of retention with a rectangular shaped fastener, such as a pin-fit connector. More generally, the central opening 130 can have a variety of different geometries to accommodate different types of corresponding fasteners with at least one angled intersection between two linear surfaces, e.g., hexagonal shaped fasteners, star shaped fasters, etc.

In other embodiments, the insert 128 may be omitted from the fastener receptacle 126. In that case, the geometry of the blind hole in the encapsulant body or the die pad, as the case may be, may be adapted to directly receive a fastener. For instance, the inner sidewalls of the blind hole may have any of the geometries of the central opening 130 from the insert 128 described with reference to FIG. 3.

Referring to FIG. 4, a semiconductor assembly 200 comprising the semiconductor package 100 mounted on a heat sink 136 is depicted. The heat sink 136 may be a metal structure with an outer surface 138 that comprises a plurality of fin shaped features so as to enhance thermal transfer to the ambient environment. As shown in FIG. 4B, the semiconductor package 100 is mounted on the heat sink 136 such that the rear surface 124 of the die pad 102 faces and is retained against a planar package interface surface 140 of the heat sink 136 by fasteners 142 that extend into the fastener receptacles 126 of the semiconductor package 100. Thus, in this arrangement the fasteners 142 maintain the position of the semiconductor package 100 so that the die pad 102 is thermally coupled to the die pad 102. The fasteners 142 may apply a mechanical pressing force such that the semiconductor package 100 is tightly held against the heat sink 136. Alternatively, the fasteners 142 may apply little to no pressing force and thus maintain the lateral position of the two structures. Optionally, the semiconductor assembly 200 may comprise a sheet of thermally conductive and electrically isolating material 144, such as a so-called thermal interface material (TIM) or a thermal grease arranged between the mounting surface of the semiconductor package 100 and the planar package interface surface 140 of the heat sink 136. This sheet of thermally conductive and electrically isolating material 144 electrically isolates the die pad 102 of the semiconductor package 100, which may be an electrically active device terminal, from the heat sink 136, while simultaneously providing efficient heat transfer between the two.

In the embodiment of FIG. 4, the semiconductor package 100 comprises two of the fastener receptacles 126 formed in the die pad 102. The heat sink 136 comprises perforations 146 that extend between the planar package interface surface 140 and an outer surface of the heat sink 136. These perforations 146 can be aligned with the blind holes of the fastener receptacles 126 so that the fastener 142 can be inserted through the perforation 146 to reach the fastener receptacles 126 of the semiconductor package 100. As shown, the semiconductor assembly 200 may further comprise a liner 148 that is disposed within the perforation 146 and receives the fastener 142. The liner 148 may act as a washer structure that enhances the mechanical pressing force of the fastener 142. Further, if electrical isolation between the semiconductor package 100 and the heat sink 136 is required, the liner 148 may be formed from an electrically insulating material, such as a plastic. As shown, the assembly may further comprise a cap 150 that covers an outer head of the fastener. The cap 150 may be formed from an electrically insulating material, such as a plastic. In that case, the cap 150 together with the liner 148 may form an electrically insulating shroud around a metal fastener 142 and therefore prevent the possibility of electrical short between the semiconductor die 106 and the exterior environment. As shown, the cap 150 may be provided together with the liner 148 with a hinged configuration. Alternatively, the cap 150 may be a standalone piece. If electrical isolation is not needed, the liner 148 and/or the cap 150 may be formed from a metal material.

Referring to FIG. 5, a semiconductor assembly 200 comprising the semiconductor package 100 mounted on a heat sink 136 is depicted, according to another embodiment. The semiconductor assembly 200 of FIG. 5, is substantially similar to the semiconductor assembly 200 described with reference to FIG. 4, except that the blind holes of the fastener receptacles 126 are formed in the encapsulant body 116 instead of the die pad 102. In a similar manner as previously described, the semiconductor package 100 is mounted on the heat sink 136 such that the rear surface 124 of the die pad 102 faces and is retained against the planar package interface surface 140 of the heat sink 136 by fasteners 142 that extend into the fastener receptacles 126 of the semiconductor package 100. In this case, since the fastener 142 is secured to the encapsulant body 116 instead of the die pad 102, it is automatically electrically isolated. Thus, the liner 148 and the cap 150 may be omitted altogether, or may be formed from an electrically conductive material, such as a metal.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
  a lead frame that comprises a die pad and a plurality of leads;
  a semiconductor die mounted on a die attach surface of the die pad;
  an encapsulant body of electrically insulating material that covers semiconductor die and portions of the lead frame; and
  a fastener receptacle that comprises a blind hole in the encapsulant body or the die pad, and
  wherein a rear surface of the die pad is exposed from a first main face of the encapsulant body.

2. The semiconductor package of claim 1, wherein the blind hole is formed in the rear surface of the die pad or the first main face of the encapsulant body.

3. The semiconductor package of claim 2, wherein the fastener receptacle further comprises an insert that is disposed within the blind hole.

4. The semiconductor package of claim 3, wherein the insert comprises a central opening that is dimensioned to receive a cylindrical fastener.

5. The semiconductor package of claim 3, wherein the insert comprises a central opening that is dimensioned to receive a snap-fit connector, the snap-fit connector comprising at least one angled intersection between two linear surfaces.

6. The semiconductor package of claim 2, wherein the blind hole is formed in the rear surface of the die pad.

7. The semiconductor package of claim 6, wherein the semiconductor die overlaps with the fastener receptacle.

8. The semiconductor package of claim 6, wherein the fastener receptacle further comprises a metal insert that is disposed within the blind hole, and wherein the insert has a greater material hardness than the die pad.

9. The semiconductor package of claim 6, wherein the fastener receptacle further comprises a second blind hole is formed in the rear surface of the die pad.

10. The semiconductor package of claim 2, wherein the blind hole is formed in the first main face of the encapsulant body.

11. The semiconductor package of claim 10, wherein the fastener receptacle further comprises a metal or plastic insert that is disposed within the blind hole, and wherein the insert has a greater material hardness than the encapsulant body.

12. The semiconductor package of claim 10, wherein the leads are disposed in an area of the first main face that is between the die pad and a first outer edge side of the encapsulant body that the leads protrude out from.

13. A semiconductor assembly comprising:
  a heat sink;
  a semiconductor package comprising an encapsulant body of electrically insulating material, a die pad with a rear surface that is exposed from a first main face of the encapsulant body, and a fastener receptacle that comprises a blind hole in the encapsulant body or the die pad; and
  a fastener that is securely retained by the fastener receptacle and affixes the semiconductor package to the heat sink.

14. The semiconductor assembly of claim 13, wherein the heat sink comprises a planar package interface surface, wherein a rear surface of the die pad is exposed from a first main face of the encapsulant body, and wherein the rear surface of the die pad faces and is retained against the planar package interface surface by the fastener.

15. The semiconductor assembly of claim 13, wherein the blind hole is formed in the rear surface of the die pad, wherein the heat sink comprises a perforation that extends between the planar package interface surface and an outer surface of the heat sink, and wherein the semiconductor assembly further comprises an electrically insulating liner that is disposed within the perforation and receives the fastener.

16. The semiconductor assembly of claim 15, wherein the semiconductor assembly further comprises an electrically insulating cap that covers an outer head of the fastener.

17. A method of producing a semiconductor package, the method comprising:
  providing a lead frame that comprises a die pad;

mounting a semiconductor die on a die attach surface of the die pad;

forming an encapsulant body of electrically insulating material that covers the semiconductor die and portions of the lead frame; and forming a fastener receptacle in the semiconductor package, wherein forming the fastener receptacle comprises forming a blind hole in the encapsulant body or the die pad.

18. The method of claim 17, wherein the blind hole is formed in a rear surface of the die pad that is exposed from the encapsulant body, and wherein forming the blind hole comprises half-etching the die pad before forming the encapsulant body.

19. The method of claim 17, wherein the blind hole is formed in a first main face of the encapsulant body, and wherein the blind hole is formed during or after forming the encapsulant body.

20. The method of claim 17, wherein forming the fastener receptacle further comprises providing an insert within the blind hole.

* * * * *